(12) United States Patent
Kim et al.

(10) Patent No.: US 12,211,899 B2
(45) Date of Patent: Jan. 28, 2025

(54) SEMICONDUCTOR DEVICE HAVING TRENCH STRUCTURE IN WHICH PROPAGATION OF THREADING DISLOCATIONS TO UPPER LAYER OF THREE-DIMENSIONAL STACKED STRUCTURE IS SUPPRESSED

(71) Applicant: KOREA INSTITUTE OF SCIENCE AND TECHNOLOGY, Seoul (KR)

(72) Inventors: Hyung-jun Kim, Seoul (KR); Seung Hwan Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 168 days.

(21) Appl. No.: 17/583,206

(22) Filed: Jan. 25, 2022

(65) Prior Publication Data

US 2022/0238654 A1    Jul. 28, 2022

(30) Foreign Application Priority Data

Jan. 28, 2021  (KR) .................. 10-2021-0012069

(51) Int. Cl.
*H01L 21/00* (2006.01)
*H01L 21/02* (2006.01)
*H01L 29/10* (2006.01)

(52) U.S. Cl.
CPC .... *H01L 29/1037* (2013.01); *H01L 21/02532* (2013.01); *H01L 21/02538* (2013.01); *H01L 21/02551* (2013.01); *H01L 21/02645* (2013.01)

(58) Field of Classification Search
CPC ......... H01L 21/02645; H01L 21/02532; H01L 21/02538; H01L 21/02551
See application file for complete search history.

(56) References Cited

U.S. PATENT DOCUMENTS

| 8,629,477 B2 | 1/2014 | Lochtefeld et al. |
| 9,318,326 B2 | 4/2016 | Von Kanel et al. |

(Continued)

FOREIGN PATENT DOCUMENTS

| KR | 10-2008-0027254 A | 3/2008 |
| KR | 10-2015-0037508 A | 4/2015 |

(Continued)

OTHER PUBLICATIONS

Yu Han et al., "Selective lateral epitaxy of dislocation-free InP on silicon-on-insulator," Applied Physics Letters, 2019, 5 pages, vol. 114, No. 192105.

(Continued)

*Primary Examiner* — Reema Patel
(74) *Attorney, Agent, or Firm* — CANTOR COLBURN LLP

(57) ABSTRACT

Embodiments relate to a semiconductor device, which includes: a substrate made of a first material; an insulating layer formed on an upper surface of the substrate; a trench formed at the insulating layer to penetrate the insulating layer toward the substrate; and a seed layer disposed in the trench. The seed layer is made of a second material, the second material lattice-mismatches with respect to the first material, the seed layer includes a threading dislocation extending at least partially in a first direction non-parallel to the upper surface of the substrate and parallel to a <110> direction of a (111) plane and a threading dislocation extending at least partially in a second direction, and the extension of the threading dislocation is terminated at a sidewall of the trench.

10 Claims, 11 Drawing Sheets

(56) References Cited

U.S. PATENT DOCUMENTS

| | | |
|---|---|---|
| 9,818,819 B2 | 11/2017 | Bai et al. |
| 10,680,126 B2 | 6/2020 | Li et al. |
| 2011/0049568 A1 | 3/2011 | Lochtefeld et al. |
| 2013/0285116 A1* | 10/2013 | Lochtefeld ........ H01L 29/66666 |
| | | 257/190 |

FOREIGN PATENT DOCUMENTS

| | | |
|---|---|---|
| KR | 10-1587430 B1 | 1/2016 |
| KR | 10-2016-0063316 A | 6/2016 |
| KR | 10-2016-0084233 A | 7/2016 |
| KR | 10-2018-0131341 A | 12/2018 |
| WO | 2006/125040 A2 | 11/2006 |
| WO | 2015/047355 A1 | 4/2015 |

OTHER PUBLICATIONS

Qiang Li et al., "Epitaxial growth of highly mismatched III-V materials on (001) silicon for electronics and optoelectronics," Progress in Crystal Growth and Characterization of Materials, 2017, pp. 105-120, vol. 63.

J.-S. Park et al., "Defect reduction of selective Ge epitaxy in trenches on S(001) substrates using aspect ratio trapping," Applied Physics Letters, 2007, 3 pages, vol. 90, No. 052113, American Institute of Physics.

* cited by examiner

SEMICONDUCTOR DEVICE HAVING TRENCH STRUCTURE IN WHICH PROPAGATION OF THREADING DISLOCATIONS TO UPPER LAYER OF THREE-DIMENSIONAL STACKED STRUCTURE IS SUPPRESSED

CROSS-REFERENCE TO RELATED APPLICATION

This application claims priority to Korean Patent Application No. 10-2021-0012069 filed on Jan. 28, 2021, and all the benefits accruing therefrom under 35 U.S.C. § 119, the contents of which in its entirety are herein incorporated by reference.

TECHNICAL FIELD

Embodiments relate to a semiconductor device in which propagation of threading dislocations in a seed layer is suppressed, and more specifically, to a semiconductor device having a trench structure for minimizing the density of threading dislocations inside the seed layer and minimizing propagation to an upper channel layer, and a method of manufacturing the same.

Description about National Research and Development Support

This study was supported by the Ministry of Science and ICT (Project No.: 1711121288, Project Name: Development of forming upper device layer made of silicon series M3D high crystallinity based on low temperature process) under the superintendence of the National Research Foundation of Korea.

BACKGROUND ART

Various semiconductor devices such as transistors are mounted on integrated circuits. Down-size scaling, which reduces the size of semiconductor devices, has greatly contributed to the growth of the semiconductor industry over the past few decades by increasing the integration density of semiconductor devices.

However, the down-size scaling is to reduce the size in the horizontal aspect. In recent years, the size has been reduced to a very small-scale level of less than 10 nm, and the difficulty of further reducing the size in the horizontal aspect has rapidly increased.

Therefore, a three-dimensional integration technology that vertically integrates to increase the integration density is in the spotlight.

As the three-dimensional integration technology, two technologies, namely TSV (Through Silicon Via) and M3D (Monolithic 3-Dimension) stacking, are emerging.

However, the TSV process has problems of low wiring density, high alignment difficulty, or high cost and process difficulty.

Meanwhile, the M3D process is a method of transferring hundreds of nm-level channel layers on a lower substrate on which a device is formed by applying a process for forming an SOI (Silicon On Insulator) structure, or a method of growing an epitaxial layer. In general, when the transfer method is used, ion implantation, wafer bonding, annealing, CMP (Chemical Mechanical Polishing) processes, and the like are used. When the epitaxial layer is grown on the lower layer, there is an advantage that a large area is possible compared to the transfer method. When the channel can be grown in high crystallinity, the M3D process using the epitaxial growth method compensates at least some of disadvantages of the TSV process.

In order to grow the high-crystalline upper channel layer, the upper channel layer should be formed on an insulating layer for insulation from the lower device layer. However, since it is very difficult to grow the highly crystalline upper channel layer on an amorphous interlayer insulating material, the crystallinity and surface orientation of the lower substrate should be transited by using a seed layer, which connects the upper channel layer and the lower substrate, when the upper channel layer grows.

However, if the seed layer is grown with a material having a different lattice constant than that of Si, dislocations are formed. The dislocations include misfit dislocations formed at the interface between the seed layer and the Si substrate and threading dislocations extending upward from the lower substrate. If the threading dislocation extends to the upper channel layer, it acts as a defect in the channel layer, which prevents device fabrication or degrades device performance.

Therefore, in order to grow a high-crystalline channel layer, it is required to minimize the density of dislocations in the seed layer (particularly, the density of threading dislocations) and to minimize the propagation to the upper channel layer.

DISCLOSURE

Technical Problem

According to embodiments of the present disclosure, in order to form a high-crystalline channel layer, there is provided a semiconductor device having a trench structure for minimizing the density of threading dislocations in a seed layer.

Technical Solution

In one general aspect, there is provided a semiconductor device; which may comprise: a substrate made of a first material; an insulating layer formed on an upper surface of the substrate; a trench formed at the insulating layer to penetrate the insulating layer toward the substrate; and a seed layer disposed in the trench. The seed layer is made of a second material, the second material lattice-mismatches with respect to the first material, the seed layer includes a threading dislocation extending at least partially in a first direction non-parallel to the upper surface of the substrate and parallel to a <110> direction of a (111) plane and a threading dislocation extending at least partially in a second direction, and the extension of the threading dislocation is terminated at a sidewall of the trench.

In an embodiment, the trench may be configured to have a first aspect ratio and a second aspect ratio of 1.37 or higher, respectively. The first aspect ratio may be a ratio of a height of one sidewall and a width between the sidewalls at a cross section in the first direction, and the second aspect ratio may be a ratio of a height of one sidewall and a width between the sidewalls at a cross section in the second direction.

In an embodiment, the trench may be configured to have a first aspect ratio and a second aspect ratio of 1.8 or higher, respectively.

In an embodiment, the trench may have a circular, elliptical or polygonal plane.

In an embodiment, the trench may have a plane in which a virtual line parallel to the corresponding plane is non-parallel to the first direction or the second direction.

In an embodiment, in the trench, an angle between the virtual line parallel to the corresponding plane and the first direction or the second direction may be 45°.

In an embodiment, the second material may include at least one of $Si_xGe_{1-x}$, a group 3-5 compound, and a group 2-6 compound.

In an embodiment, the first material may be made of a material containing Si.

In an embodiment, the second material may be made of a material containing Si.

In an embodiment, the first material may be made of a material containing Si.

The semiconductor device according to the above embodiments may further comprise: at least one other trench; and at least one other seed layer. The plurality of trenches formed at the insulating layer may be disposed to be spaced apart from each other.

In an embodiment, the plurality of trenches may be arranged to be spaced apart from each other in the first direction or the second direction.

In an embodiment, among the trenches arranged to be spaced apart from each other along a line, one trench and another trench are different in terms of at least one of planar arrangement and shape.

Advantageous Effects

The semiconductor device according to an aspect of the present disclosure has a trench structure that prevents threading dislocations in the first direction and threading dislocations in the second direction parallel to the <110> direction of the (111) plane from extending to the channel layer in the seed layer on the surface of the substrate.

In particular, the trench reduces the density (namely, dislocation density) at which the threading dislocations are propagated to the upper channel layer even when a ratio of horizontal length to vertical length (namely, an aspect ratio) of the seed layer is small in the cross section of the semiconductor device.

DESCRIPTION OF DRAWINGS

In order to more clearly explain the technical solution of the present disclosure or the embodiment of the prior art, drawings necessary in the description of the embodiments are briefly introduced below. Like reference numbers are used to identify like elements shown in at least one drawing. It should be understood that the following drawings are for the purpose of explaining the embodiments of the present specification and not for the purpose of limitation. In addition, some elements to which various modifications such as exaggeration and omission have been applied may be shown in the drawings below for clarity of description.

BEST MODE

Figure 1:
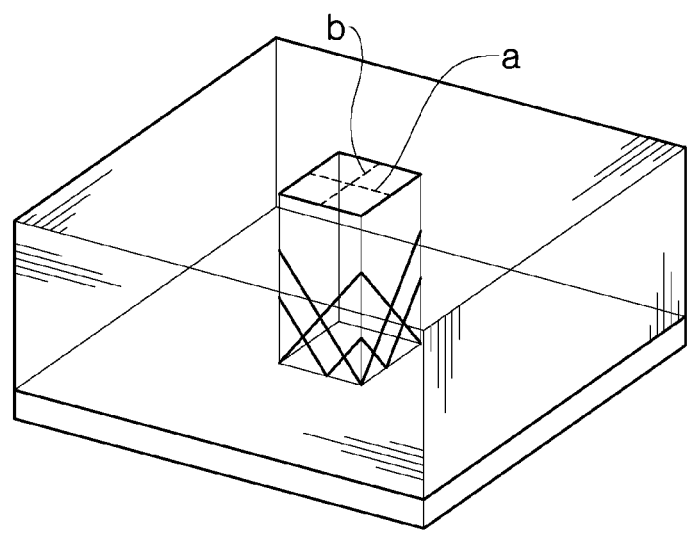
FIG. 1 is a transparent perspective view showing a semiconductor device having a trench according to an embodiment of the present disclosure.

Terms such as "above" and "below" representing relative spaces may be used for explain a relation between two components more easily on the drawings. These terms are intended to include not only features as depicted in the drawings but also features or operations in an actual use. For example, if a device is overturn on the drawing, any components which have been described as being "below" other components may be explained as being "above" other components in the overturn state. Therefore, the term "below" may include both an upper direction and a lower direction. A device may rotate by 90 degrees or another angle, and the terms representing relative spaces should be interpreted accordingly.

In case it is mentioned that any component is located "on" another component, the component may be located directly on another component, or any other component may be interposed between them. However, if it is mentioned that any component is located "directly on" another component, no other component is interposed between then.

Terms "first", "second", "third" or the like are used for explaining various components, ingredients, areas, layers and/or sections, without being limited thereto. These terms are just used for distinguishing any component, ingredient, area, layer or section from another. Therefore, any "first component, ingredient, area, layer or section" recited below may also be mentioned as a "second component, ingredient, area, layer or section" without departing from the scope of the present disclosure.

The terminology used herein is for the purpose of describing particular embodiments only and is not intended to be limiting of the present disclosure. As used herein; the singular forms "a"; "an" and "the" are intended to include the plural forms as well, unless the context clearly indicates otherwise. It will be further understood that the term "includes" when used in this specification, specifies the presence of stated features, regions, integers, steps, operations; elements, and/or components, but does not preclude the presence or addition of one or more other features, regions, integers, steps, operations, elements, components, and/or groups thereof.

Hereinafter, embodiments of the present disclosure will be described in detail with reference to the accompanying drawings. However, the present disclosure is not limited to the embodiments disclosed below, but will be implemented in various different forms, and only the following embodiments allow the present disclosure to be complete and fully indicates the category of the present disclosure to those skilled in the art.

FIG. 1 is a transparent perspective view showing a semiconductor device having a trench according to an embodiment of the present disclosure, Referring to FIG. 1, the semiconductor device 1 includes a substrate 10;

an insulating layer 20; a trench 30; and a seed layer 40. In some embodiments, the semiconductor device 1 may further include a channel layer (not shown).

The substrate 10 may include Si or include any one selected from the group consisting of $SixGe_{1-x}$, Ge, a group 3-5 compound, and a group 2-6 compound, or a combination thereof. The group 3-5 compound is a compound containing elements of Groups 3 and 5 on the periodic table, and may be, for example, a compound such as GaP, GaAs, InAS, AlAs, InP, InSb, AlSb, or the like.

The insulating layer 20 is formed on the substrate 10. The insulating layer 20 includes various dielectric materials. The insulating layer 20 may include, for example, any one selected from the group consisting of $SiO_2$, SiNx, SiOxNy, AlN, HfOx, ZrOx, or a combination thereof, but is not limited thereto.

In one embodiment, the insulating layer 20 defines the structure of the trench 30. The insulating layer 20 provides a sidewall of the trench 30. The trench 30 defined by the insulating layer 20 will be described in more detail with reference to FIGS. 2 to 4 below.

Figure 2A:
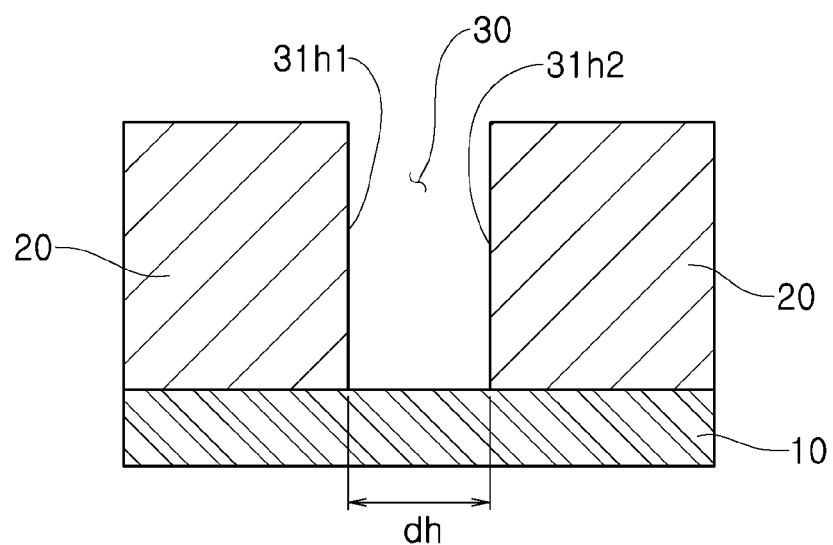
FIG. 2A is a lateral sectional view showing the semiconductor device of FIG. 1 including threading dislocations, viewed in a first direction.
Figure 2B:
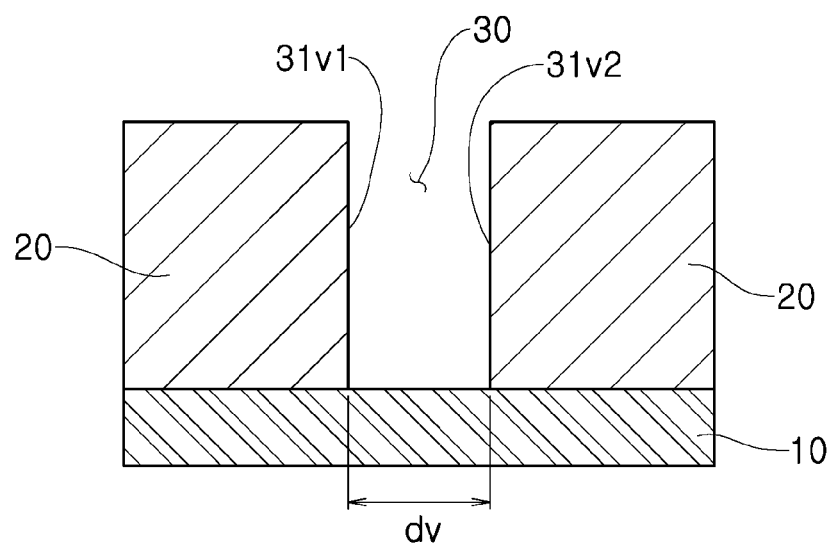
FIG. 2B is a lateral sectional view showing the semiconductor device of FIG. 1 including threading dislocations, viewed in a second direction.

FIG. 2A is a lateral sectional view showing the trench, cut along one lateral line (a) of FIG. 1, and FIG. 2B is a lateral sectional view showing the trench, cut along another lateral line (b) of FIG. 1.

Referring to FIGS. 1 and 2, the trench 30 exposes the sidewall of the insulating layer 20 to the outside, and when an arbitrary material is filled therein, the trench 30 has a lateral sectional shape in which the material and the substrate may form an interface.

The trench 30 has an opening shape so that the insulating layer 20 is at least partially penetrated inward from the upper surface of the insulating layer 20 toward the substrate.

The plane of the trench 30 has an arbitrary shape, surrounded by the insulating layer 20. The trench 30 has sidewalls 31h1, 31h2 disposed opposite to each other in a first direction, as shown in FIG. 2A, in a cross section parallel to the first direction (a of FIG. 1) on the upper surface of the substrate 10. In addition, the trench 30 has sidewalls 30v1, 30v2 disposed opposite to each other in a second direction, as shown in FIG. 2B, in a cross section parallel to a second direction (b of FIG. 1) on the upper surface of the substrate 10.

The second direction is a direction non-parallel to the first direction on the upper surface of the substrate 10. In one example, the first direction is a horizontal direction on the upper surface of the substrate 10, and the second direction is a vertical direction on the upper surface of the substrate 10. Here, the horizontal/vertical direction on the upper surface of the substrate 10 means a horizontal/vertical direction among the [110] directions of a two-dimensional surface with respect to the upper surface when any material is grown on the upper surface of the substrate 10. The trench 30 has an interval Dh between the sidewalls 30h1, 30h2 facing in the first direction and an interval Dv between the sidewalls 30v1, 30v2 facing in the second direction. The interval Dv is smaller than an interval between one side and the other side of the insulating layer 20 parallel to the second direction.

That is, the semiconductor device 1 includes at least one non-line type trench 30 that does not extend from one side of the insulating layer 20 to the other side thereof.

In one embodiment, the trench 30 may have a circular, elliptical or polygonal plane. In one example, the plane of the trench 30 has a rectangular or square shape.

In some embodiments, the plane of the trench 30 may have a rectangular or square shape with a height parallel to the first direction or the second direction. Referring to the above example again, when the plane of the trench 30 has a square shape, the horizontal direction of the square may be the first direction, and the vertical direction of the square may be the second direction.

In some other embodiments, the plane of the trench 30 may have a rectangular or square shape in which a direction non-parallel to the first direction or the second direction is a direction between one end and the other end (e.g., a height direction). This will be described later in more detail with reference to FIG. 6.

The height of the trench 30 is defined by the thickness of the insulating layer 20, and the height of the trench 30 is from the interface to the upper surface of the insulating layer 20.

The height and the sectional width (gap) of the trench 30 have a first aspect ratio and a second aspect ratio. The first aspect ratio is a ratio of the height of the sidewall 31h1 or 31h2 and the width between the sidewalls 31h1 and 31h2 in the cross section in the first direction of FIG. 2A. The second aspect ratio is a ratio of the height of the sidewall 31v1 or 31v2 and the width between the sidewalls 31v1 and 31v2 in the cross section in the second direction of FIG. 2B.

That is, in the trench 30, the height in the first direction is designed by the first aspect ratio, and the height in the second direction is designed by the second aspect ratio.

The aspect ratio for determining the height of the trench 30 will be described later in more detail with reference to FIGS. 3 to 5.

The seed layer 40 is disposed in the trench 30. The seed layer 40 includes a second material that lattice-mismatches with respect to the first material included in the substrate 10. The second material is used to grow a channel layer (not shown) that will be formed on the seed layer 40.

In one embodiment, the substrate 10 may include Si as the first material. Then, the seed layer 40 includes a material lattice-mismatching with the Si as the second material. For example, the seed layer 40 may include any one selected from the group consisting of $SixGe_{1-x}$, Ge, a group 3-5 compound, and a group 2-6 compound, or a combination thereof, but is not limited thereto.

In another embodiment, the seed layer 40 may include Si as the second material. Then, the substrate 10 includes a material lattice-mismatching with the Si as the first material. For example, the substrate 10 may include any one selected from the group consisting of $SixGe_{1-x}$, Ge, a group 3-5 compound, and a group 2-6 compound, or a combination thereof, but is not limited thereto.

Due to the lattice mismatch, the semiconductor device 1 including the seed layer 40 and substrate 10 has dislocations. The dislocations include a misfit dislocation and a threading dislocation.

The misfit dislocation is formed at the interface between the seed layer 40 and the substrate 10.

Meanwhile, the threading dislocation is formed in the form of propagating non-parallel to the upper surface of the substrate 10 from the end of the misfit dislocation. That is, the threading dislocation extends in a vertical direction with respect to the upper surface of the substrate 10. For example, the extension direction of the threading dislocation has a component of the sidewall direction.

The threading dislocation propagates at least partially in the first direction or the second direction parallel to the <110> direction of the (111) plane at the end of the misfit dislocation formed in the <111> direction on the three-dimensional structure. When the threading dislocation is projected onto the upper surface of the substrate 10, the threading dislocation extends in a forward or reverse direction of the first direction or extends in a forward or reverse direction of the second direction among the two-dimensional [110] directions. That is, if the threading dislocation is projected onto the upper surface of the substrate 10, the seed layer 40 includes the threading dislocation extending in four directions, namely upper, lower, left and right directions, as shown in FIG. 5 below, along the [110] direction on the upper surface of the substrate 10, For clarity of description, the present disclosure will be described in more detail by calling the threading dislocation extending along the first direction when being projected as the first threading dislocation and calling the threading dislocation extending in the second direction when being projected as the second threading dislocation.

The trench 30 is configured to have a first aspect ratio and a second aspect ratio, respectively, to prevent the first threading dislocation and the second threading dislocation in the seed layer 40 from passing through the planar region of the trench 30 and contacting the channel layer on the seed layer 40.

Based on the first direction, the aspect ratio means a ratio of the height of the sidewall perpendicular to the first direction and the interval between sidewalls arranged opposite to each other parallel to the first direction.

That is, the trench 30 has an aspect ratio for relatively reducing the density at which the first threading dislocation and the second threading dislocation propagate to the upper layer (e.g., the channel layer). That is, the trench 30 has a structure in which the probability of suppressing both the first threading dislocation and the second threading dislocation increases.

The aspect ratio determines that the extension of the threading dislocation ends at the sidewall 31.

Figure 3A:
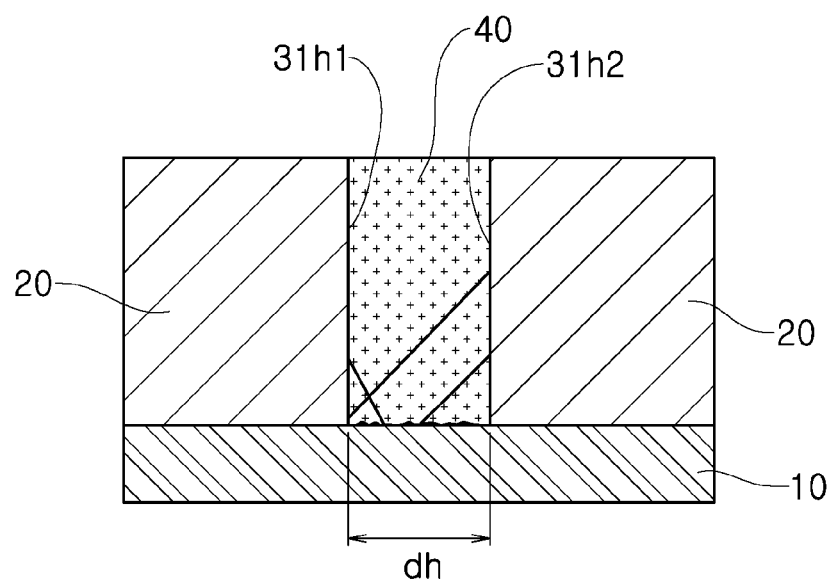
FIG. 3A is a lateral sectional view showing the semiconductor device including a seed layer formed at the trench of FIG. 2, viewed in the first direction.
Figure 3B:
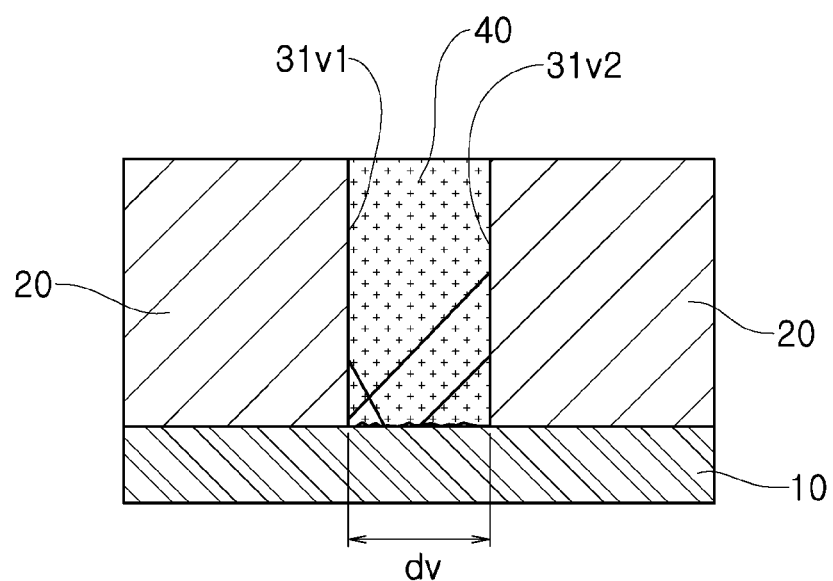
FIG. 3B is a lateral sectional view showing the semiconductor device including a seed layer formed at the trench of FIG. 2, viewed in the second direction.

FIG. 3A is a lateral sectional view showing the semiconductor device including a seed layer formed at the trench of FIG. 2, viewed in the first direction, and FIG. 3B is a lateral sectional view showing the semiconductor device including a seed layer formed at the trench of FIG. 2, viewed in the second direction.

Referring to FIG. 3A, the trench 30 has a first aspect ratio in which the first threading dislocation extending in the first direction and non-parallel to the upper surface of the substrate 10 is terminated at the sidewall 31h1 or 31h2.

Also, referring to FIG. 3B, the trench 30 has a second aspect ratio in which the second threading dislocation extending in the second direction and non-parallel to the upper surface of the substrate 10 is terminated at the sidewall 31v1 or 31v2.

Among all of the first threading dislocations and second threading dislocations included in the seed layer 40, the first threading dislocation and the second threading dislocation except for some of them that naturally end in the seed layer 40 (that is, the extension is terminated within the seed layer 40) are terminated by at least one of the (110) planes forming the sidewall of the trench 30.

The first aspect ratio and the second aspect ratio of the trench 30, which plays such a role, depend on properties of the second material of the seed layer 40 and properties of the first material of the substrate 10. This is because the extension angle of the threading dislocation has a tendency according to lattice mismatch. Here, the extension angle of the threading dislocation represents an angle between the upper surface of the substrate 10 and the extension direction of the threading dislocation in the lateral cross section of the semiconductor device 1 cut in the first direction or the second direction as shown in FIGS. 3A and 3B.

The first aspect ratio and the second aspect ratio are designed based on the extension angle in the corresponding sectional direction.

Figure 4:
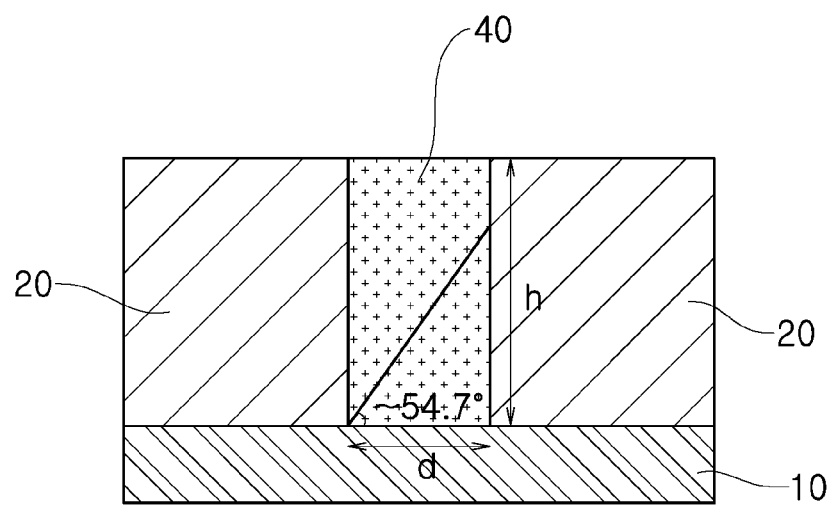
FIG. 4 is a diagram for explaining a relationship of an aspect ratio and an extension angle according to an embodiment of the present disclosure.

FIG. 4 is a diagram for explaining a relationship of an aspect ratio and an extension angle according to an embodiment of the present disclosure.

Referring to FIG. 4, each of the first aspect ratio and the second aspect ratio is expressed by the following equation.

$$H > d * \tan \theta \quad \text{[Equation 1]}$$

h is the height of the corresponding sidewall, d is the distance between the sidewalls, and θ is the extension angle. The extension angle θ is an extension angle of the threading dislocation that may be formed in the combination of the substrate 10 and the seed layer 40 including the first material and the second material, respectively.

The extension angle of the threading dislocation is up to 60°, and generally has an angle in the range of 54° to 55°.

In one embodiment, the trench 30 may have a first aspect ratio and a second aspect ratio of 1.37 or higher. Then, the first threading dislocation and the second threading dislocation propagating at an extension angle of 54° or less are terminated at the sidewall 31 of the trench 30.

In another embodiment, the trench 30 may have a first aspect ratio and a second aspect ratio of 1.74 or higher. Then, the first threading dislocation and the second threading dislocation propagating at an extension angle of 55° or less are terminated at the sidewall 31 of the trench 30.

In still another embodiment, the trench 30 may have a first aspect ratio and a second aspect ratio of 1.8 or higher. Then, in the trench 30, the first threading dislocation and the second threading dislocation propagating at an extension angle of 60° or less are terminated at the sidewall 31 of the trench 30.

For example, the extension angle of threading dislocation may be 54.7°. Then, trench 30 has a first aspect ratio and a second aspect ratio with a value of 1.41 or higher in order to suppress both the first threading dislocation and the second threading dislocation.

However, the aspect ratio of the trench 30 does not increase infinitely, and is in a range to have a thickness similar to or smaller than that of a general insulator 20.

Alternatively, the first aspect ratio and the second aspect ratio of the trench 30 may be different from each other. For example, the first aspect ratio may be 1.8, and the second aspect ratio may be 1.41.

Figure 5:
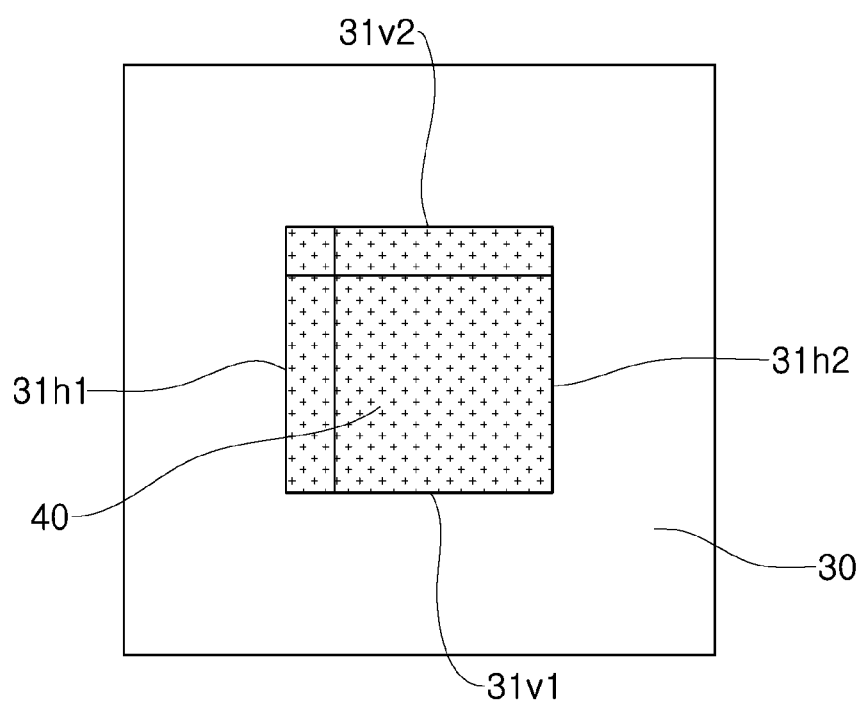
FIG. 5 is a plan view showing the semiconductor device of FIG. 3.

FIG. 5 is a plan view showing the semiconductor device of FIG. 3.

The trench 30 may be configured to have both the first and second aspect ratios described above, so that both the first threading dislocation and the second threading dislocation are terminated at the sidewall 31 and propagation to the upper channel layer is suppressed, as shown in FIGS. 4 and 5.

Since both the first threading dislocation and the second threading dislocation may be suppressed as described above, in the semiconductor device 1, the probability of suppressing the propagation of the threading dislocation to the upper layer (e.g., the channel layer) increases by at least 50%, compared to the case of being capable of suppressing only the threading dislocation in only one direction.

That is, under the condition that the thickness of the insulating layer is the same, in the semiconductor device of FIG. 5, the probability of forming a threading dislocation that exists at the top of the seed layer 40 is reduced by about 50%, compared to the case of being capable of suppressing the threading dislocation in only one direction.

In addition, assuming that the top of the seed layer 40 has the same threading dislocation density, in the semiconductor device of FIG. 5, the insulating layer 20 may be fabricated to be relatively thin, compared to the case of being capable of suppressing the threading dislocation in only one direction. For example, even if the thickness of the insulating layer 20 is reduced by about 50%, it is possible to design the semiconductor device of FIG. 5 having the threading dislocation density at the top to the same degree as the case of being capable of suppressing the threading dislocation in only one direction.

As a result, in order to obtain the same quality (that is, the same threading dislocation density), the insulating layer 20 has a relatively small thickness compared to the case of being capable of suppressing the threading dislocation in only one direction. Therefore, in the semiconductor device 1 of FIG. 5, the epitaxial growth process becomes easier, and the connection distance between the upper and lower layers is shortened, so that the RC delay is reduced, and consequently, the overall circuit performance may be improved.

Figure 6:
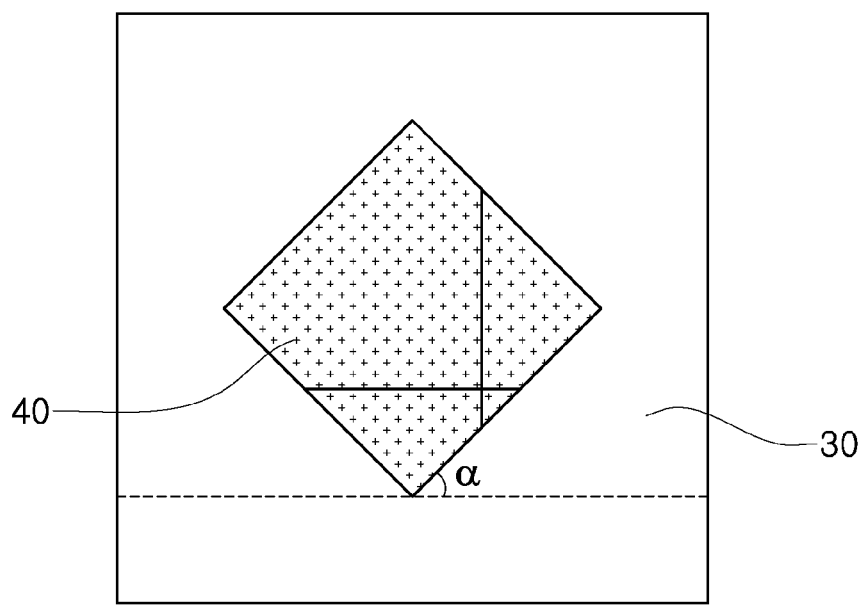
FIG. 6 is a plan view showing a semiconductor device including a tilted trench according to another embodiment of the present disclosure.
Figure 7:
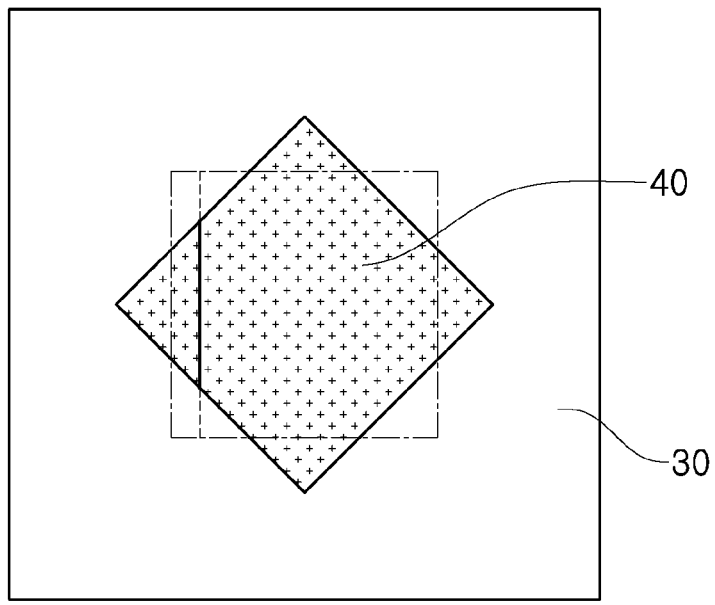
FIG. 7 is a diagram for comparing suppression performance of the semiconductor device of FIG. 6 and the semiconductor device of FIG. 5.

FIG. 6 is a plan view showing a semiconductor device including a tilted trench according to another embodiment of the present disclosure, and FIG. 7 is a diagram for comparing suppression performance of the semiconductor device of FIG. 6 and the semiconductor device of FIG. 5.

Referring to FIG. 6, the trench 30 having the polygonal plane has a plane in which a virtual line parallel to the corresponding plane is non-parallel to the first direction or the second direction. For example, the trench 30 has a rectangular plane in which one side of the corresponding rectangular plane is non-parallel to the first direction or the second direction. That is, the angle α in FIG. 6 may not be 0°.

Alternatively, when the trench 30 has an elliptical plane, the virtual line may be a line passing through the center of the ellipse. For example, the virtual line may be a line on the major axis or the minor axis of the ellipse. Then, the trench 30 has an elliptical plane in which the major axis (or minor axis) of the corresponding elliptic plane is non-parallel to the first direction or the second direction.

Since the threading dislocation is formed in the <110> direction of the (111) plane as described above, if the trench 30 is formed so that the angle α is not 0°, the area where the extension distance of the threading dislocation projected onto the substrate 10, namely propagating in the <110> direction, is reduced increases.

FIG. 7 is a diagram for comparing suppression performance of the semiconductor device of FIG. 6 and the semiconductor device of FIG. 5.

As shown in FIG. 7, the probability that the length of the first threading dislocation and the second threading dislocation projected on the upper surface of the substrate 10 in the trench 30 of FIG. 6 becomes shorter than the length projected in the trench 30 of FIG. 5 increases.

That is, the density at which the threading dislocation propagates to the upper layer (e.g., the channel layer) with respect to the same area is further reduced, thereby further increasing the probability of suppressing propagation.

In some embodiments, the trench 30 may have an angle of 45° between the virtual line and the first or second direction. For example, when the trench 30 has a rectangular shape, the angle between one side of the rectangle and the first direction (or the second direction) may be 45°. When the trench 30 is elliptical, the angle of the major axis (or the minor axis) of the ellipse may be 45°.

Then, the area where the distance extending in the [110] direction decreases is maximized, and thus the probability of suppressing propagation of the threading dislocation to the upper layer (e.g., the channel layer) further increases. That is, in this embodiment, the probability of suppressing propagation of the threading dislocation to the upper layer (e.g. the channel layer) may be further reduced to less than 50%, compared to the case of being capable of suppressing the threading dislocation only in one direction.

Also, the semiconductor device 1 may include a plurality of trenches 30. Then, the semiconductor device 1 may include a plurality of seed layers 40 respectively disposed in each trench 30.

Figure 8:
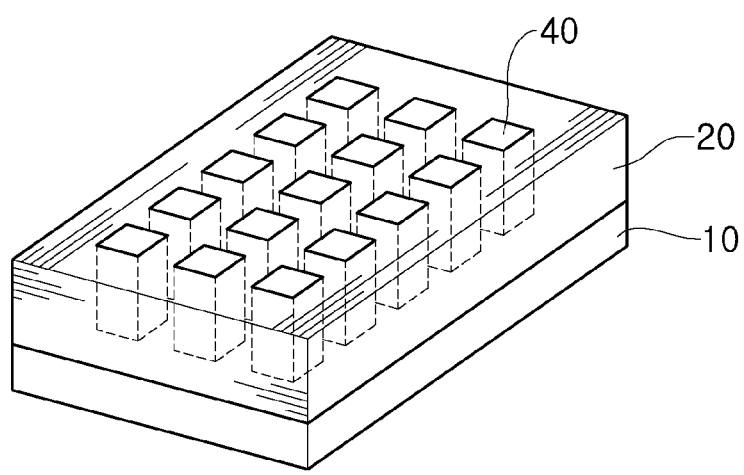
FIG. 8 is a transparent perspective view showing a semiconductor device having a plurality of trenches according to an embodiment of the present disclosure.

FIG. 8 is a transparent perspective view showing a semiconductor device having a plurality of trenches according to an embodiment of the present disclosure.

Referring to FIG. 8, the plurality of trenches 30 are spaced apart from each other so that the planes of the trenches 30 do not include regions overlapping each other.

In one embodiment, the plurality of trenches 30 may be arranged to be spaced apart from each other along the first direction and/or the second direction. Then, the semiconductor device 1 may include a subset of trenches 30 spaced apart from each other along each line.

In addition, the subset of trenches 30 spaced apart along each line may be configured to have the plane of FIG. 5 or the plane of FIG. 6. That is, a first trench 30 having a rectangular plane with one side parallel to the first direction and a second trench 30 with one cross section non-parallel to the first direction may be disposed along the same line. That is, even within the same line, one trench 30 and another trench 30 may have different arrangement structures based on the first direction or the second direction.

In addition, the subset of trenches 30 spaced apart along each line may include trenches 30 having different planar shapes from each other. For example, even within the same line, one trench 30 may have a circular pattern, and another trench 30 may have a rectangular pattern.

In this way, the subset of trenches 30 spaced apart from each other along each line may include one trench 30 and another trench 30, which are different from each other in terms of at least one of planar arrangement and shape.

As such, the semiconductor device 1 is configured to suppress propagation of the first threading dislocation and the second threading dislocation, particularly the second threading dislocation, to the upper layer, and consequently, a higher-crystalline channel layer may be formed using the semiconductor device 1.

Figure 9:
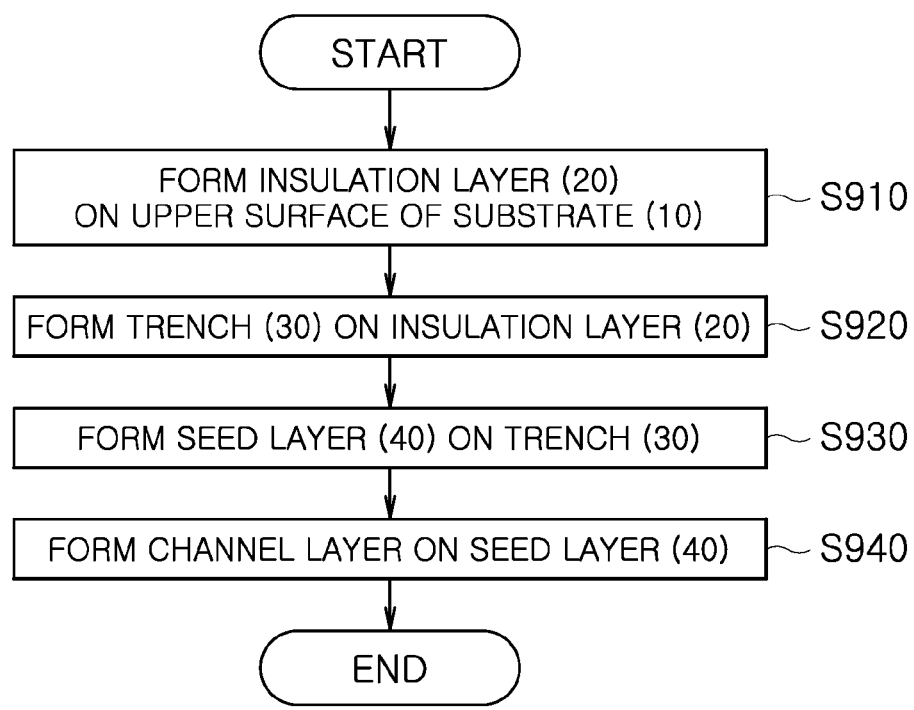
FIG. 9 is a flowchart for illustrating a method of manufacturing the semiconductor device of FIG.

FIG. 9 is a flowchart for illustrating a method of manufacturing the semiconductor device of FIG. 1.

Referring to FIG. 9, the method of manufacturing the semiconductor device 1 includes the steps of: forming an insulating layer 20 on a substrate 10 made of a first material (S910); forming a trench 30 on the insulating layer 20 (S920); and disposing a seed layer 40 on the trench 30 (S930). Also, the manufacturing method may further include the step of: forming a channel layer on the seed layer 40 (S940).

The trench 30 is generated by various processes that make a step on the surface. For example, the trench 30 is generated by patterning the insulating layer 20 (S920).

If the trench 30 is generated by a mask-based patterning process, the mask includes a mask pattern for having the plane of the trench 30 described above. By the patterning process, the trench 30 is configured to have the aspect ratio (i.e. the first aspect ratio and the second aspect ratio) described above with reference to FIGS. 1 to 8.

The seed layer 40 is formed on the trench 30 by an epitaxial growth method (S930). The seed layer 40 to be formed for the growth of the upper layer is grown along high crystals of the lower layer. In the semiconductor device 1 having such a planar pattern, the difficulty of considering the completed device and/or integrated circuit in the lower layer in aligning the pattern is relatively reduced. This is obvious in light of the fact that a device having a pattern that suppresses the threading dislocation in a specific one direction must be aligned and designed by avoiding the finished device and/or integrated circuit of the lower layer, compared to the semiconductor device 1 according to the embodiments of the present disclosure. In addition, the same applies in terms of designing the device and/or integrated circuit of the lower layer using the semiconductor device 1.

In this way, the method of manufacturing the semiconductor device 1 uses the existing technology of manufacturing a transistor such as CMOS, and by controlling the pattern, it is possible to grow a high-crystalline upper layer (e.g., a channel layer). In addition, the upper layer may also use the existing process technology, so it has great versatility in manufacturing memory and logic devices.

While the exemplary embodiments have been shown and described, it will be understood by those skilled in the art that various modifications in form and details may be made thereto without departing from the scope of the present disclosure as defined by the appended claims. However, such modifications should be regarded as falling within the scope of the present disclosure. Therefore, the true scope of the present disclosure should be defined by the appended claims.

The invention claimed is:

1. A semiconductor device, comprising:
a substrate made of a first material;
an insulating layer formed on an upper surface of the substrate;
a plurality of trenches formed in the insulating layer to penetrate the insulating layer toward the substrate and arranged to be spaced apart from each other in a first direction and a second direction perpendicular to the first direction, wherein a subset of trenches spaced apart along a straight line among the plurality of trenches include trenches having different shapes from each other in a plan view; and
a seed layer disposed in the plurality of trenches,
wherein the seed layer is made of a second material,
the second material lattice-mismatches with respect to the first material,
for at least one trench of the plurality of trenches, the seed layer includes a threading dislocation extending non-parallel to the upper surface of the substrate and parallel to a <110>direction of a (111) plane when being projected onto the upper surface of the substrate,
the threading dislocation includes a first threading dislocation extending in the first direction when being projected onto the upper surface of the substrate and a second threading dislocation extending in the second direction when being projected onto the upper surface of the substrate, and
an extension of the first threading dislocation is terminated at a first sidewall of the at least one trench and an extension of the second threading dislocation is terminated at a second sidewall of the at least one trench.

2. The semiconductor device according to claim 1,
wherein the at least one trench is configured to have a first aspect ratio and a second aspect ratio, which are 1.37 or higher, respectively,
wherein the first aspect ratio is a ratio of a height of the first sidewall and a width between the first sidewall and a sidewall of the at least one trench opposite to the first sidewall in the first direction, and
wherein the second aspect ratio is a ratio of a height of the second sidewall and a width between the second sidewall and a sidewall of the at least one trench opposite to the second sidewall in the second direction.

3. The semiconductor device according to claim 2,
wherein the at least one trench is configured to have the first aspect ratio and the second aspect ratio, which are 1.8 or higher, respectively,
the first aspect ratio and the second aspect ratio are different from each other.

4. The semiconductor device according to claim 1,
wherein the plurality of trenches have a circular, elliptical or polygonal plane.

5. The semiconductor device according to claim 1,
wherein another trench of the plurality of trenches has a plane in which a virtual line parallel to the corresponding plane is non-parallel to the first direction or the second direction.

6. The semiconductor device according to claim 5,
wherein in the another trench, an angle between the virtual line parallel to the corresponding plane and the first direction or the second direction is 45°.

7. The semiconductor device according to claim 1,
wherein the second material includes at least one of the group of $Si_xGe_{1-x}$, Ge, a group 3-5 compound, and a group 2-6 compound.

8. The semiconductor device according to claim 7,
wherein the first material includes a material containing Si.

9. The semiconductor device according to claim 1,
wherein the second material includes a material containing Si.

10. The semiconductor device according to claim 9,
wherein the first material includes at least one of the group of $Si_xGe_{1-x}$, Ge, a group 3-5 compound, and a group 2-6 compound.

* * * * *